(12) United States Patent
Dahlhaus et al.

(10) Patent No.: US 11,329,635 B1
(45) Date of Patent: May 10, 2022

(54) FREQUENCY MODIFYING GATE DRIVER IC

(71) Applicant: Infineon Technologies AG, Neubiberg (DE)

(72) Inventors: Mathias Dahlhaus, Hannover (DE); Kevin Pluch, Munich (DE); Jens Barrenscheen, Munich (DE)

(73) Assignee: Infineon Technologies AG, Neubiberg (DE)

(*) Notice: Subject to any disclaimer, the term of this patent is extended or adjusted under 35 U.S.C. 154(b) by 0 days.

(21) Appl. No.: 17/129,671

(22) Filed: Dec. 21, 2020

(51) Int. Cl.
*H03K 3/017* (2006.01)
*H03K 5/00* (2006.01)
*G06F 1/06* (2006.01)

(52) U.S. Cl.
CPC ......... *H03K 3/017* (2013.01); *H03K 5/00006* (2013.01); *G06F 1/06* (2013.01)

(58) Field of Classification Search
CPC ....... H03K 3/017; H03K 5/00006; G06F 1/06
USPC .......................... 327/108, 109, 110, 111, 112
See application file for complete search history.

(56) References Cited

U.S. PATENT DOCUMENTS

| 8,519,750 B2 * | 8/2013 | Kimura | H03K 17/04123 327/109 |
| 8,860,523 B2 * | 10/2014 | Odagiri | H03K 4/06 332/109 |
| 2008/0018376 A1 * | 1/2008 | Godes | H03K 17/04123 327/376 |
| 2014/0002141 A1 * | 1/2014 | Barrenscheen | H02M 1/08 327/108 |

OTHER PUBLICATIONS

"Application note—An introduction to LLC resonant half-bridge converter," No. AN2644, Rev. 2, from STMicroelectronics, Sep. 2008, 64 pp.

"Basic Principles of LLC Resonant Half Bridge Converter and DC/Dynamic Circuit Simulation Examples," Publication No. AND9408/D, from Semiconductor Components Industries, LLC, Apr. 2016, 9 pp.

(Continued)

*Primary Examiner* — John W Poos
(74) *Attorney, Agent, or Firm* — Shumaker & Sieffert, P.A.

(57) ABSTRACT

Techniques for controlling a power converter with a control signal and circuitry configured to translate the control signal into one or more pulse modulated drive signal(s) to operate the power converter. The translation circuitry may receive the control signal, extract frequency information, duty cycle, dead time, and other information from the control signal, and output at least one pulse modulated drive signal, based on the extracted information, to a driving stage that may operate the power converter. The control signal may be a digital signal that includes rising edges and falling edges. The edges of the first type may define the frequency information. The edges of the second type may define other information extracted by the translation circuitry, e.g., duty cycle, dead time and so on. In some examples the power converter may be a resonant power converter.

20 Claims, 6 Drawing Sheets

(56) References Cited

OTHER PUBLICATIONS

Abdel-Rahman, S., "Resonant LLC Converter: Operation and Design 250W 33 Vin 400Vout Design Example," Application Note AN 2012-09, V1.0, from Infineon Technologies North America (IFNA) Corp., Sep. 2012, 19 pp. retrieved from https://www.infineon.com/dgdl/Infineon-MOSFET_OptiMOS_resonant_LLC_converter_operation_and_design-AN-v01_00-EN.pdf?fileId=db3a30433acf32c9013ad11cddde01b6, on Sep. 8, 2020, 19 pp.
Huang, H., "Designing an LLC Resonant Half-Bridge Power Converter," 2010 Texas Instruments Power Supply Design Seminar SEM1900, Topic 3, TI Literature No. SLUP263, 2010, 2011, 30 pp. (Applicant points out, in accordance with MPEP 609.04(a), that the year of publication, 2010, is sufficiently earlier than the effective U.S filing date, so that the particular month of publication is not in issue.).
Ma C., "Topic review—Gallium Nitride High-Electron-Mobility Transistor," from E Scholarly Community Encyclopedia 2020, retrieved from https://encyclopedia.pub/371, on Aug. 6, 2020, 7 pp.

\* cited by examiner

FREQUENCY MODIFYING GATE DRIVER IC

TECHNICAL FIELD

The disclosure relates power converters, and specifically to control circuitry for power converters.

BACKGROUND

Some examples of power converters, e.g., DC-DC power converters, may receive drive signals from control circuitry to operate the power converter. For example, a control loop may monitor the output power, voltage or current from the power converter and adjust the drive signals to ensure the power converter outputs the desired power at the desired voltage and current. Changes in the load demand, such as turning on or off and changing operating modes of equipment supplied by the power converter may cause changes in the voltage or current at the power converter output. The control circuitry may adjust the drive signals to ensure the output power stays within the desired tolerance.

SUMMARY

In general, the disclosure describes techniques for controlling a power converter with a control signal and circuitry configured to translate the control signal into one or more pulse modulated drive signal(s) to operate the power converter. The circuitry, e.g., translation circuitry, may receive the control signal, extract frequency information, duty cycle, dead time, and other information from the control signal, and output at least one pulse modulated drive signal, based on the extracted information, to a driving stage that may operate the power converter. The control signal may be a digital signal that includes rising edges and falling edges. The edges of the first type, e.g., the falling edges, may define the frequency information. The edges of the second type, e.g., the rising edges, may define other information extracted by the translation circuitry, e.g., duty cycle, dead time and so on. In some examples the power converter may be an LLC power converter and the pulse modulated drive signal may be a pulse width modulated (PWM) drive signal configured to drive the control terminals of a half-bridge or full-bridge drive circuit.

In some examples, this disclosure describes a system comprising a controller configured to output a control signal comprising a plurality of edges of a first type and a plurality of edges of a second type. The system further includes translation circuitry operatively coupled to the controller, the translation circuitry configured to: receive the control signal and output a drive signal comprising a first characteristic and a second characteristic. A time duration between the edges of the first type may define the first characteristic of the drive signal, and a time duration between edges of the first type and edges of the second type may define the second characteristic of the drive signal.

In some examples, this disclosure describes a pattern generator circuit, the circuit configured to: receive a control signal comprising a plurality of edges of a first type and a plurality of edges of a second type and output a drive signal comprising a first characteristic and a second characteristic. A time duration between the edges of the first type may define the first characteristic of the drive signal, and a time duration between edges of the first type and edges of the second type may define the second characteristic of the drive signal.

In other examples, this disclosure describes a method comprising receiving a control signal comprising a plurality of edges of a first type and a plurality of edges of a second type and extracting a first characteristic from the control signal. A time duration between the edges of the first type defines the first characteristic of the drive signal. The method further includes extracting a second characteristic from the control signal, wherein a time duration between edges of the first type and edges of the second type defines the second characteristic of the drive signal, and outputting the drive signal based on the extracted first characteristic and the second characteristic.

The details of one or more examples of the disclosure are set forth in the accompanying drawings and the description below. Other features, objects, and advantages of the disclosure will be apparent from the description and drawings, and from the claims.

DETAILED DESCRIPTION

The disclosure describes techniques for controlling a power converter with a control signal, and circuitry configured to translate the control signal into a pulse modulated drive signal to operate the power converter. The translation circuitry may extract frequency information, duty cycle, dead time, and other information from the control signal, and output a pulse modulated drive signal, based on the extracted information, to a driving stage that may operate the power converter. The control signal may be a digital signal that includes rising edges and falling edges. The edges of the first type, e.g. the falling edges, may define the frequency information. The edges of the second type, e.g. the rising edges, may define other information extracted by the translation circuitry, e.g., duty cycle, dead time and so on. In another example, rising edges may be used for defining the frequency information.

In some examples, the driving stage may include components, such as transistors or other type of electrically controlled switches, that may operate the power converter more efficiently at higher frequencies, e.g. approximately 100-400 kHz. Power converters operating at lower frequencies, e.g. approximately 10-30 kHz may be less efficient and more expensive, e.g. due to other inductors or capacitors. Operating at higher frequencies may also allow for smaller passive components, such as coils, e.g. inductors and transformers, capacitors, which may reduce cost, weight, and size of a power converter. A driving stage may output pulse width modulation (PWM) drive signal to control the switching patterns and switching times for transistors in the power converter. The resolution of the pulse width is the granularity in which pulse width can be set. To operate a transistor at higher frequencies, the input signal of the driving stage should also be at the higher frequency. The combination of switching frequency and resolution may limited by the capabilities of the source of the control signal, e.g., processing circuitry such as a microcontroller. Processing circuitry configured to output higher frequency driver signals with a high timing resolution may be more expensive and more difficult to obtain when compared to processing circuitry configured to operate at lower frequencies.

The techniques of this disclosure may provide a higher frequency drive signal to improve system efficiency without increasing the dynamic behavior of the overall system, e.g. without increasing the control loop speed. A controller of this disclosure may output a lower frequency control signal on a single line. The control signal may carry frequency, duty cycle, dead time and other information. The translation circuitry may receive the control signal, extract the information, and output a higher frequency drive signal to the driving stage. In some examples the power converter may be an LLC power converter and the pulse modulated drive signal may be a pulse width modulated drive signal configured to drive the control terminals of a half-bridge or full-bridge drive circuit The techniques of this disclosure may provide several advantages when compared to other techniques. For example, according to techniques of this disclosure, the controller may output a lower frequency control signal with a high timing/frequency resolution, and therefore may be less expensive to implement than a controller configured to output a higher frequency drive signal. The translation circuitry may be located near the driving stage and power converter, while the controller may be located at a distance from the power converter. Because the control signal of this disclosure is at a lower frequency, the control signal may travel through conductors over a longer distance with fewer complications from parasitic coupling, losses, radiation and electromagnetic interference (EMI) associated with sending higher frequency signals over a distance. The high frequency drive signal to the driving stage results in improved efficiency for some types of transistors, such as some field effect transistors (FETs) and GaN-HEMT (Gallium-Nitride High-Electron-Mobility-Transistor). Also, as noted above, the higher frequency driving signal may allow for smaller passive components.

Figure 1:
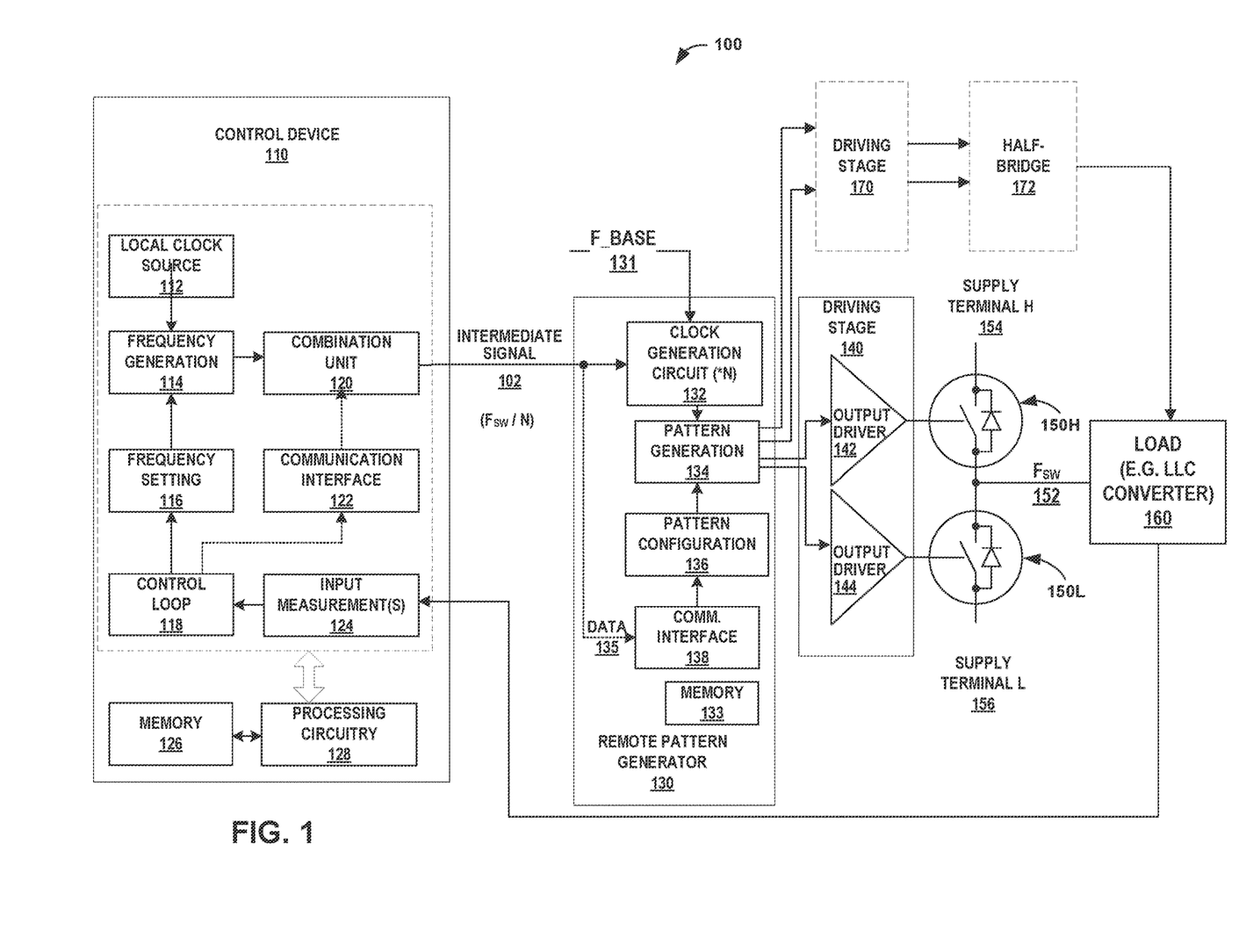
FIG. 1 is a block diagram illustrating an example system including translation circuitry configured to receive a control signal and output a pulse modulated drive signal to operate a power converter.

FIG. 1 is a block diagram illustrating an example system including translation circuitry configured to receive a control signal and output a pulse modulated drive signal to operate a power converter. In system 100, the translation circuitry of remote pattern generator 130 may extract frequency information, duty cycle, dead time, and other information from a control signal, e.g. intermediate signal 102. The translation circuitry may output a pulse modulated drive signal, based on the extracted information, to driving stage 140 to drive transistors 150H and 150L that may operate a power converter of load 160.

In the example of FIG. 1, system 100 includes control device 110, remote pattern generator 130, driving stages 140 and 170, a half bridge circuit including transistor 150H and 150L, and in some examples a second half bridge circuit 172, that operate load 160. In some examples, load 160 may include a power converter, such as an LLC converter or some other DC-DC power converter circuit. The components of system 100 are configured to outsource high frequency signal generation from control device 110 into the remote pattern generator 130, thus increasing overall system performance and releasing control device 110 from the need to generate the high frequency pulse modulated signals with a high timing/frequency resolution. The communication interface may be a 1-wire interface between the remote pattern generator 130 and control device 110 carrying intermediate signal 102. In this manner, control device 110 may transmit data defining characteristics for the pulse modulated signals to be output from remote pattern generator 130 and the output frequency for the drive signals may be derived from intermediate signal 102.

Control device 110 includes processing circuitry 128 operatively coupled to memory 126. Processing circuitry 128 may receive signals from and control the functions of input measurements circuit 124, control loop 118, communication interface 122, frequency setting circuit 116, frequency generation circuit 114, local clock source 112, and combination unit 120. The blocks of control unit 110 in the example of FIG. 1 describe one possible arrangement of a control device of this disclosure. In other examples the blocks of control device 110 may be combined or arranged in a different manner than depicted in FIG. 1.

Examples of processing circuitry 128 in control device 110 may include any one or more of a microcontroller (MCU), e.g. a computer on a single integrated circuit containing a processor core, memory, and programmable input/output peripherals, a microprocessor (µP), e.g. a central processing unit (CPU) on a single integrated circuit (IC), a controller, a digital signal processor (DSP), an application specific integrated circuit (ASIC), a field-programmable gate array (FPGA), a system on chip (SoC) or equivalent discrete or integrated logic circuitry. A processor may include integrated circuitry, i.e., integrated processing circuitry, and that the integrated processing circuitry may be realized as fixed hardware processing circuitry, programmable processing circuitry and/or a combination of both fixed and programmable processing circuitry.

Examples of memory 126 may include any type of computer-readable storage media. Types of memory may include random access memory (RAM), read only memory (ROM), programmable read only memory (PROM), erasable programmable read only memory (EPROM), one-time programable (OTP) memory, electronically erasable programmable read only memory (EEPROM), flash memory, or another type of volatile or non-volatile memory device. In some examples the computer readable storage media may store instructions that cause the processing circuitry to execute the functions described herein. In some examples, the computer readable storage media may store data, such as configuration information, temporary values and other types of data used to perform the functions of this disclosure.

Input measurements circuit 124 may receive indications from sensors within load 160, or other portions of system 100 (not shown in FIG. 1). Examples of sensors may include current, voltage, frequency, temperature or other sensors. In some examples input measurement circuit 124 may include analog to digital converter (ADC) circuitry. Input measurements circuitry 124 may process the received indications such as by amplifying, digitizing, combining signals and performing calculations. Input measurements circuitry may output resultant measurement results to control loop 118.

Based on the received measurement results, control loop 118 may drive adjustments to other components of control device 110. In the example of FIG. 1, control loop 118 connects to frequency setting circuitry 116 and communication interface 122. In the example in which load 160 includes a resonant converter, such as an LLC converter, control of the LLC converter may depend on precise control of the switching signal frequency from the half-bridge circuit, Fsw 152. Changing the frequency of the switching signal may control the power output to the load of a resonant converter by shifting the working point across the attenuation-curve of the LLC's impedance. Granularity of the duty cycle may not be as important as granularity of the frequency for these types of converters. Based on the feedback signals from input measurement circuits 124, e.g. the converter output voltage, control loop 118 may cause frequency setting circuit 116 to adjust the frequency of intermediate signal 102.

Frequency generation circuit 114 may receive the output from both local clock source 112 and frequency setting circuit 116 and provide a signal at the desired drive signal frequency with the desired frequency accuracy and granularity to combination unit 120. In some examples, the frequency output by frequency generation circuit may be some fraction of the desired drive frequency Fsw 152 to be output by the half-bridge circuit of transistors 150H and 150L, e.g. Fsw/N, where N is an integer. In other examples, the fraction may be given by a factor of N/M or may include an additional offset value.

Communication interface 122 may receive information from control loop 118, which may define adjustments to the duty cycle, dead time, timing jitter and other characteristics for the pulse modulated signal output by remote pattern generator 130 to make adjustments to the operation of the resonant converter of load 160. Communication interface 122 may convert the defined adjustments to a communication protocol, such as a data stream or a stream of data symbols. Combination unit 120 may receive the signal at the desired frequency from frequency generation circuit 114 and modulate the defined adjustments according to the communication protocol onto the signal from frequency generation circuit 114. Combination unit 120 may output intermediate signal 102 to remote pattern generator 130.

In some examples, intermediate signal 102 may include one or more "channels" to communicate characteristics of the drive signal, e.g. Fsw 152. Intermediate signal 102 may be a pulse modulated signal, e.g., a cyclical signal made up of rising edges and falling edges. As discussed above, the communication interface between remote pattern generator 130 and control device 110 may comprise a single wire interface carrying intermediate signal 102. The different features of intermediate signal 102, e.g. the frequency, pulse width and so on, may be considered different "channels" used to convey information to remote pattern generator 130 about how to generate the high frequency pulse modulated signals used to drive the power converter of load 160. For example, as noted above, the frequency of intermediate signal 102 may be considered a channel that carries frequency information for the drive signal in the form of a fraction (Fsw/N or similar fraction) of the desired drive signal frequency. Frequency may be defined as a time duration between the edges of a first type for intermediate signal 102. For example, a time duration between falling edges of intermediate signal 102 may be considered a channel that defines the characteristic of the frequency for the drive signal to the power switches, e.g., Fsw 152. A second channel may be a time duration between edges of the first type and edges of the second type of intermediate signal 102, which may define a second characteristic for the drive signal. Other channels may include voltage magnitude, driver strength, thresholds for protection mechanisms, or other features modulated onto intermediate signal 102. As discussed above, characteristics of the drive signal may include frequency, duty cycle, dead time, jitter, and so on.

Remote pattern generator 130 may receive intermediate signal 102, decode the information modulated into the "channels" of intermediate signal 102 and generate an output to the driving stages to drive the half-bridge circuits that operate load 160. In the example of FIG. 1, remote pattern generator 130 includes clock generation circuit 132, pattern generation circuit 134, pattern configuration circuit 136, and communication interface 138. The functional blocks of remote pattern generator 130 in FIG. 1 are arranged to describe the function of remote pattern generator 130. In other examples, the functional blocks may be combined, rearranged or otherwise organized to provide the functions of remote pattern generator 130.

Clock generation circuit 132 may receive intermediate signal 102, and based on the frequency of intermediate signal 102, clock generation circuit 132 may output a higher frequency to operate the power converter via one or more half-bridge circuits of system 100. The higher frequency drive signal may allow for smaller passive components, e.g. smaller energy-storing components such as coils and capacitors. For example, wide band gap (WBG) semiconductor devices semiconductors such as SiC, GaN, and diamond may include superior material properties compared to other transistors formed with other materials and which may allow operation at high-switching speed, high-voltage and high-temperature to operate the system more efficiently than if the system operated at a lower frequency.

Clock generation circuit 132 is a frequency modification circuit. In some examples, clock generation circuit 132 may be implemented as a frequency multiplier circuit, for example using a phase-locked loop circuit. For example, clock generation circuit 132 may receive intermediate signal 102, at a frequency of Fsw/N, and multiply the frequency to output a signal with frequency of Fsw. In this manner, control device 110 operates the control feedback loop to output a high resolution frequency adjustment to control the output power of the resonant power converter of load 160. In some examples, a resonant converter frequency, may be greater than 100-200 kHz. Such a high frequency and fine granular frequency setting may require a high local clock frequency, e.g. from local clock source 112. But remote pattern generator 130 generates the high frequency, which therefore requires less costly control circuitry that does not need to be capable of generating the high frequencies.

In some examples, system 100 may include an additional frequency offset, F_base 131 and clock generation circuit 132 may modify the frequency of intermediate signal 102 by adding or subtracting the frequency offset, e.g. F_base 131. The frequency offset F_base 131 may project the input frequency range of intermediate signal 102 upon a desired higher output frequency range, such that the output frequency maintains the high granularity of frequency control provided by control device 110. In some examples, control device 110 may generate and output F_base 131 to remote pattern generator 130. In other examples, remote pattern generator 130 may internally generate F_base 131. In other examples, F_base 131 may come from another component of system 100 not shown in FIG. 1.

Control device 110 determines the switching pattern for driving stage 140 and modulates timing and pattern information onto intermediate signal 102. Communication interface 138 may also receive intermediate signal 102 and extract the data 135, e.g. data words, modulated onto the various channels of intermediate signal 102. Communication interface 138 may provide this extracted information to pattern configuration circuit 136. Pattern configuration circuit 136 may set the switching timing, duty cycle, driver strength, and so on based on the extracted information.

In some examples, remote pattern generator 130 may store the translated results of drive signal characteristics at a storage element, e.g., a register or memory 133. In other words, store the information derived from the stream of data symbols that define the drive signal characteristics at a storage element. In this disclosure, a "data symbol" may indicate a digital ONE, a digital ZERO or some other data symbol. In other examples, remote pattern generator 130 may store a translated result of one or more characteristics at a second storage element (not shown in FIG. 1) separate from the first storage element. For example, remote pattern generator 130 may store the derived frequency information, e.g., from clock generation circuit 132 at a first memory and store the pattern information, e.g., from communication interface 138 or pattern configuration circuit 136 at a second memory. In another example, a first storage element may contain a duty cycle information and a second storage element may contain a driver strength information, both extracted from the data or symbol stream.

Pattern generation circuit 134 receives the output pattern from clock generation circuit 132, e.g., the frequency, and the switching timing from pattern configuration circuit 136 to generate the signal output to the driving stages. The signal output from pattern generation circuit 134 includes rising and falling edges, duty cycle and timing to control the turn-on and turn-off timing of the power switches, e.g., switch 150H and switch 150L.

In the example of an LLC converter as load 160, output control of the LLC receives fine-granular frequency settings, e.g. Fsw 152, from the half-bridge circuit. That is, Fsw 152 may comprise a frequency setting with normal to high dynamics. In the example of FIG. 1, a first half-bridge circuit including power switch 150H and 150L, provide the output, Fsw 152, to load 160 from a switching node between the cathode of the body diode of switch 150L and the anode of the body diode of switch 150H. The cathode of the body diode of switch 150H connects to a high side supply terminal, supply terminal H 154. The anode of the body diode of switch 150L connects to the low side supply terminal, supply terminal L 156. The pulse modulated signal from driving stage 140, which includes output driver 142 and output driver 144, may include a dead time. Control device 110 may determine the dead time, e.g., off time between the switch OFF of one power switch and the switch ON of the second power switch and modulate that dead time value as data onto intermediate signal 102. However, the duty cycle of the switch control signal from driving stage 140, e.g. a pattern configuration with low dynamics when compared to the frequency granularity, may not be used for control purposes for a resonant converter like an LLC converter because the frequency adjustments provide the control. Power switches 150H and 150L may be implemented with field effect transistors (FETs), GaN-HEMT, an insulated gate bipolar junction transistor (IGBT) or other types of power switches. In the example of FIG. 1, output drivers 142 and 144 connect to the control terminals of switches 150H and 150L. In some examples in which switches 150H and 150L are FETs, IGBTs or similar switches, the control terminals of switches 150H and 150L are the gates of switches 150H and 150L.

In some examples, the output from the power switches to load 160 may include an un-wanted DC offset, which may be caused by imperfect half-bridge characteristics. This unwanted DC offset may be eliminated by generating a pulse modulated, e.g., PWM, signal with a duty cycle other than 50% to counteract the DC offset. Counteracting the DC offset may avoid asymmetry (e.g., ripple) between the half waves at the output of the resonant converter of load 160. In the disclosure, the techniques to avoid a 50% duty cycle may be referred to as low-resolution duty cycle modulation.

Because precise PWM resolutions may be not needed for these types of resonant converters, the frequency modification techniques of this disclosure may be applied to any LLC, forward converter, a bidirectional full-bridge CLLC resonant converter, zero-voltage switching half-bridge (ZVS-HB) or any quasi-resonant or resonant converters. The duty cycle of the switching signal may be defined for these converters based on configuration or events in the driver, and not directly defined by the duty cycle of the input signal defining the frequency. Control device 110 may adjust the pattern and timing details modulated onto intermediate signal 102 based on the type of converter of load 160.

Figure 2A:
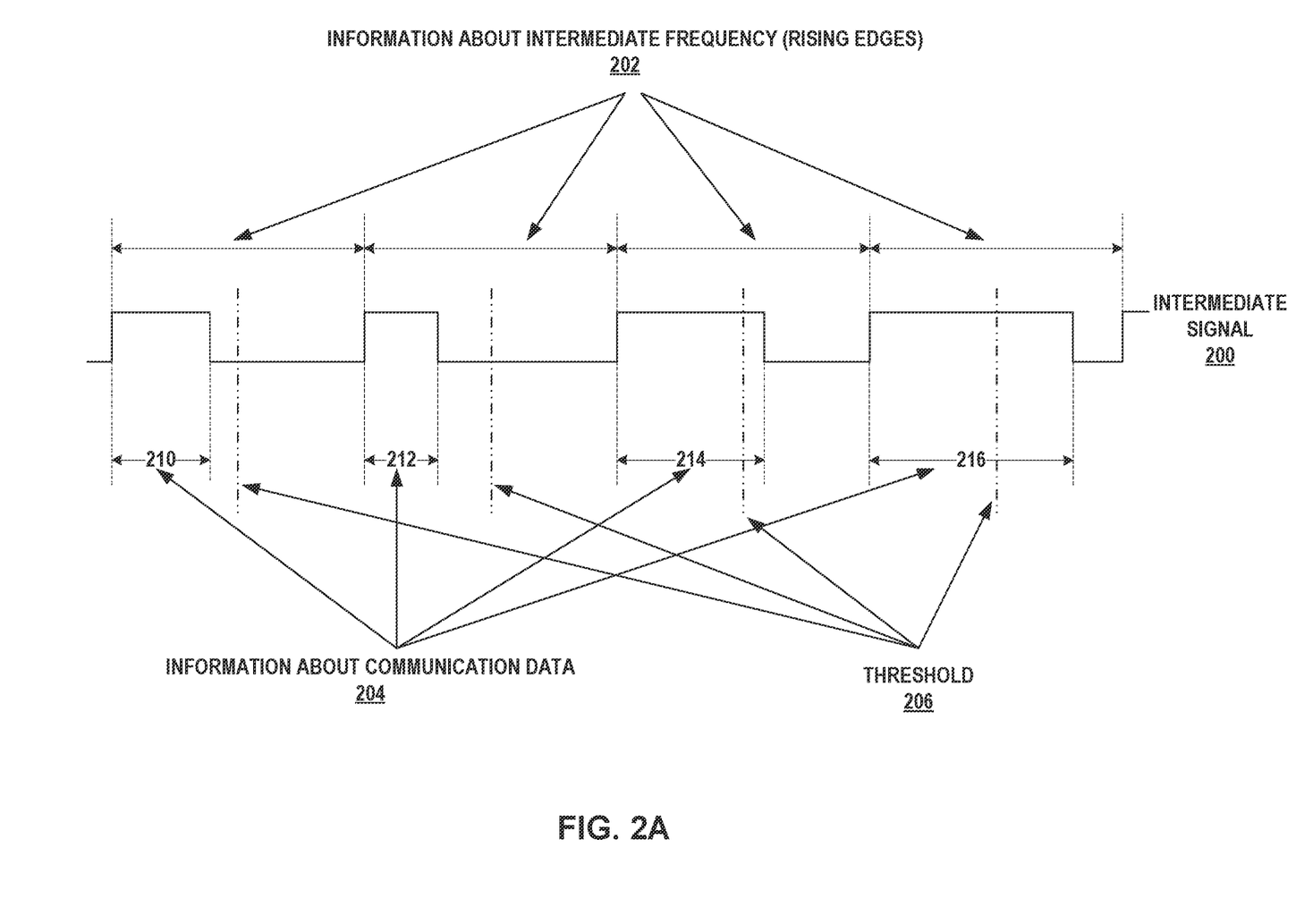
FIG. 2A is a timing diagram illustrating an example of a control signal that defines frequency information and data information to configure a pattern for the drive signal according to one or more techniques of this disclosure.

FIG. 2A is a timing diagram illustrating an example of a control signal that defines frequency information and data information to configure a pattern for the drive signal according to one or more techniques of this disclosure. Intermediate signal 200 is an example of intermediate signal 102 described above in relation to FIG. 1.

In the example of FIG. 2A, the time duration between the rising edges of intermediate signal 200 may be translated by remote pattern generator 130, described above in relation to FIG. 1, as the basis for the frequency of the drive signal to the power switches. In other words, the frequency of intermediate signal 200 received by the translation circuitry provides a first characteristic of drive signal frequency. As described above in relation to FIG. 1, the translation circuitry of remote pattern generator 130 may include frequency modification circuitry, e.g., a frequency multiplication circuitry, such as clock generation circuit 132, which is configured to receive intermediate signal 200, e.g., the control signal, and set the drive signal frequency based on a frequency of the control signal.

Processing circuitry may modulate, e.g., encode, other characteristics, such as pattern characteristics of the drive signal onto the control signal. In FIG. 2A, a time duration between edges of the first type, e.g., the rising edges, and edges of the second type, e.g., the falling edges, may define a symbol stream. A symbol may contain one or more data bits. In one example, each period of the control signal may define one symbol. In another example, a symbol may extend to more than one period of the control signal. Data words extracted from the symbol stream may define one or more other characteristics of the drive signal. In other words, processing circuitry may modulate intermediate signal 200 and generate a symbol stream by adjusting changing the time duration between the rising and falling edges (204), e.g., adjusting the duty cycle, to encode information in form of a symbol stream onto intermediate signal 200. For example, the processing circuitry may set time duration 210 and duration 212 to be less than a threshold 206 for a first symbol or part of a first symbol, while time durations 214 and 216 are greater than threshold 206 for a second symbol or part of a second symbol. In some examples, the remote pattern generator may translate duty cycles less than threshold 206 as a first digital symbol, e.g. a digital ZERO, and duty cycles greater than threshold 206 as a second digital symbol, e.g. a digital ONE. Said another way, the processing circuitry may encode symbols as part of data words using the time duration between edges of the first type and edges of the second type. Communication interface 138 of FIG. 1 may extract the data words from the symbol stream based on a sequence of respective time durations between edges of the first type and edges of the second type. In this manner the processing circuitry, e.g., control device 110 of FIG. 1, may send data indicating the characteristics that remote pattern generator should use to generate the drive signal. In some examples, the data word may be based on a digital code, e.g., a 4-bit, 8-bit, 10-bit, or some similar digital code.

In the example of FIG. 2A, threshold 206 is approximately at half the duration of each period of intermediate signal 200. In other examples, threshold 206 may be set at any duration, e.g. a quarter period, a third of a period, and so on. In other examples, the modulation scheme for the information about communication data 204 may include multiple thresholds. For example, a first threshold at one third of the period and a second threshold at two-thirds of the period (not shown in FIG. 2A). In some examples, a duty cycle less than the first threshold may indicate a digital ONE, a duty cycle greater than the second threshold may indicate a digital ZERO and one or more duty cycles between one-third and two-thirds of the duration may indicate the end of a digital symbol. The processing circuitry and translation circuitry may also implement other modulation encoding schemes, not described in this disclosure.

Figure 2B:
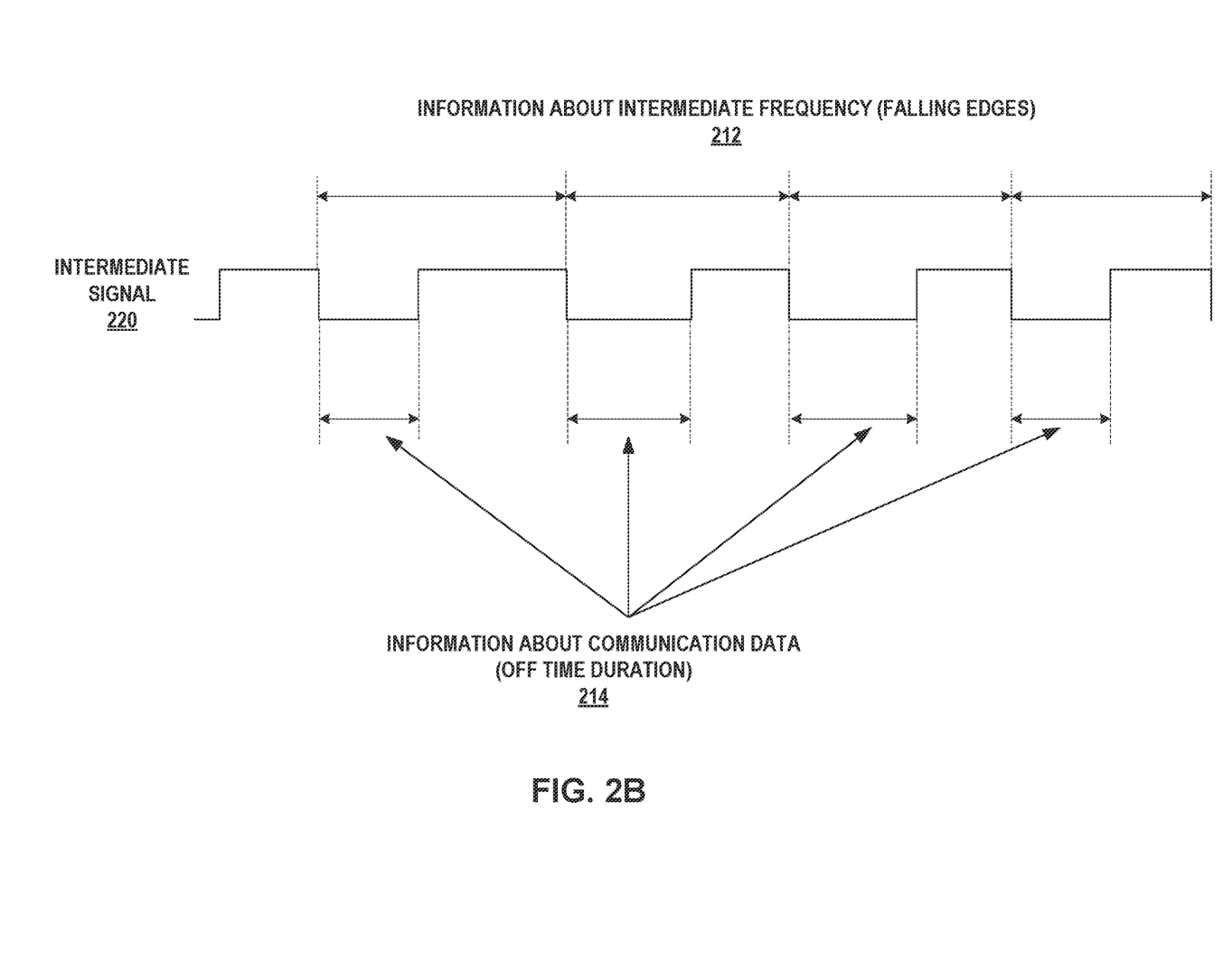
FIG. 2B is a timing diagram illustrating an alternate example of a control signal that defines frequency information and data information to configure a pattern for the drive signal according to one or more techniques of this disclosure.

FIG. 2B is a timing diagram illustrating an alternate example of a control signal that defines frequency information and data information to configure a pattern for the drive signal according to one or more techniques of this disclosure. Intermediate signal 220 is also an example of intermediate signal 102 described above in relation to FIG. 1.

As described above for the example of FIG. 2A, the time duration between the edges of a first type for intermediate signal 220, e.g., the falling edges, may be translated by remote pattern generator 130 of FIG. 1, as the basis for the frequency of the drive signal to the power switches. The frequency modification circuitry, e.g., a frequency multiplier such as clock generation circuit 132, may be configured to receive intermediate signal 220, e.g., the control signal, and set the drive signal frequency based on a frequency of the control signal.

As with intermediate signal 200 of FIG. 2A, the duty cycle of intermediate signal 220 may be considered a channel that carries data defining other characteristics of the drive signal. In other words, in FIG. 2B, a time duration between edges of the first type, e.g. the falling edges, and edges of the second type, e.g., the rising edges, may define one or more other characteristics of the drive signal. Although not shown in FIG. 2B, the duty cycles for each period of intermediate signal 220 may also be compared to one or more threshold durations. The remote pattern generator may translate the duty cycles into digital ONES, ZEROS and so on based on the comparison to the thresholds.

Figure 3:
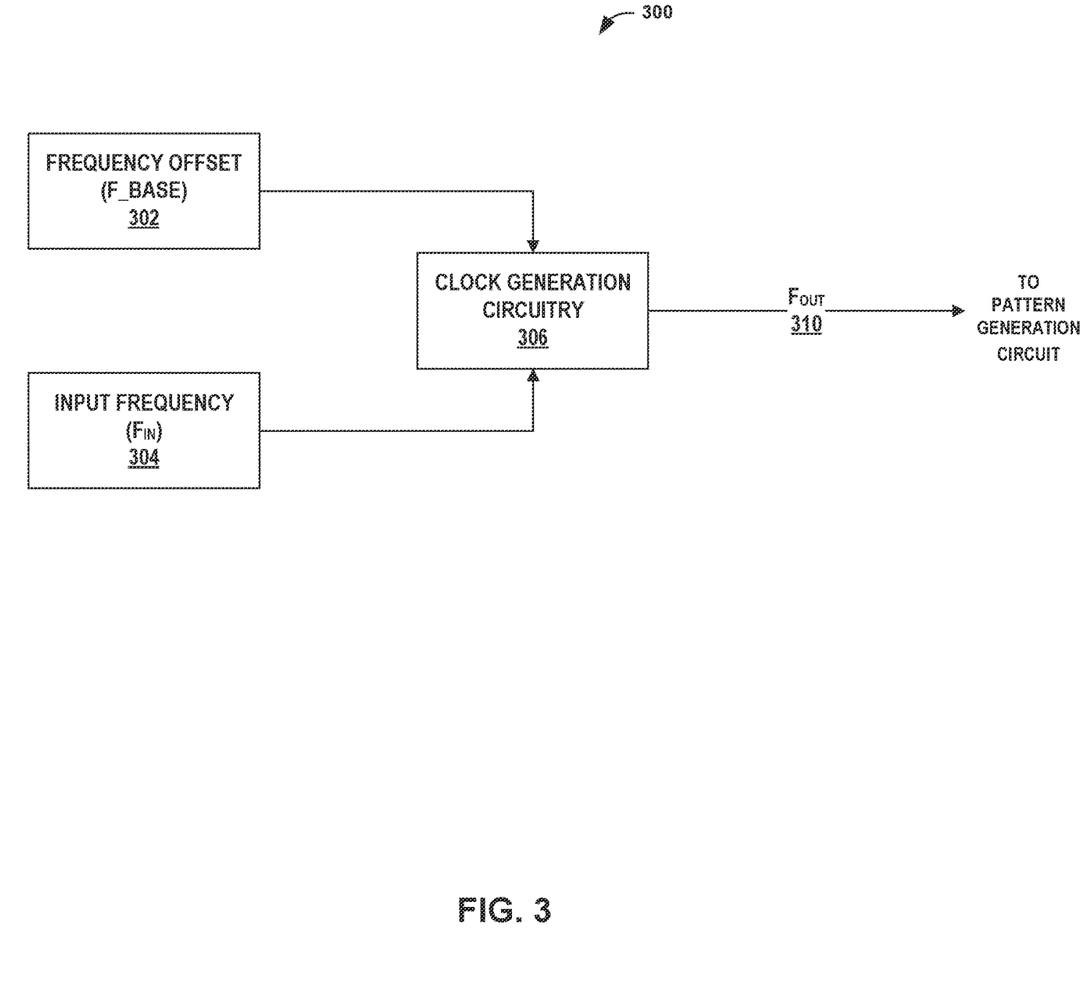
FIG. 3 is a block diagram illustrating an example of the frequency generation circuitry according to one or more techniques of this disclosure.

FIG. 3 is a block diagram illustrating an example of the frequency generation circuitry according to one or more techniques of this disclosure. System 300 includes components that are examples of system 100 described above in relation to FIG. 1. For example, frequency offset, F_base 302 and clock generation circuit 306 are respectively, examples of F_base 131 and clock generation circuit 132 described above in relation to FIG. 1. Input frequency, Fin 304, is an example of the frequency of intermediate signal 102 depicted in FIG. 1, e.g., Fin=Fsw/N.

F_base 302 may be considered an additional frequency offset input to the frequency multiplication circuit of the remote pattern generator. In some examples, the frequency multiplication circuit may be implemented as a PLL. Frequency offset, F_base 302 may provide the ability for the remote pattern generator to project an input frequency range, of Fin 304, upon a desired higher output frequency range, for Fout 310, and maintain the frequency granularity that may be desirable for control of a resonant converter. A signal with output frequency Fout 310 may be sent to pattern generation circuit 134, described above in relation to FIG. 1. Using a frequency offset may improve frequency resolution, which is useful for resonant converter control.

Figure 4:
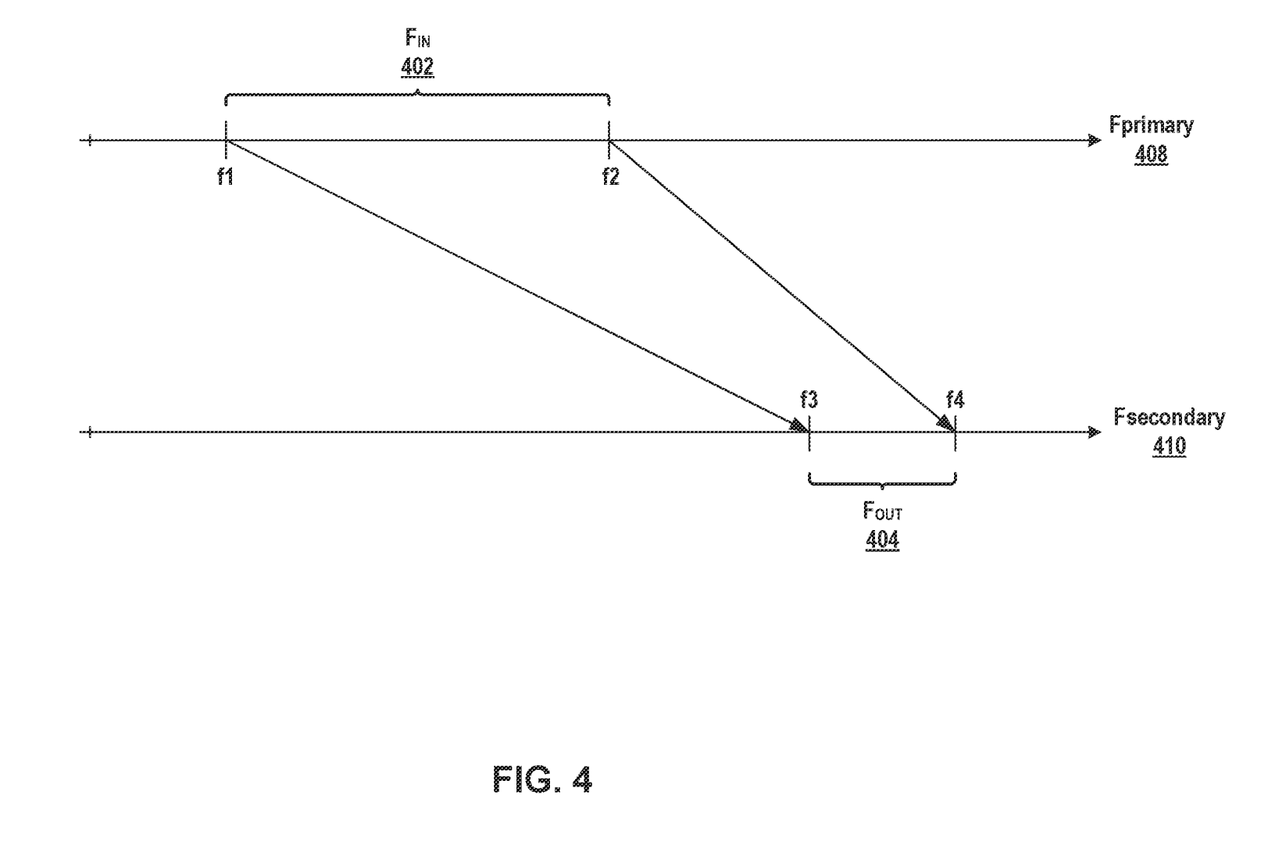
FIG. 4 is a graph illustrating an example of converting a fine resolution lower frequency signal into a fine resolution higher frequency drive signal according to one or more techniques of this disclosure.

FIG. 4 is a graph illustrating an example of converting a fine resolution lower frequency signal into a fine resolution higher frequency drive signal according to one or more techniques of this disclosure. In this disclosure fine resolution frequency control indicates an ability to change the frequency in small increments or steps, e.g., a step size of 1 Hz. A coarse resolution frequency control indicates the limitation to increase frequency in larger increments when compared to a fine resolution, e.g., in step size of 10 Hz, 100 Hz, 1000 Hz and so on. High granularity and fine resolution are equivalent terms in this disclosure as are low granularity and coarse resolution.

As discussed above in relation to FIG. 3, using a frequency offset may provide the ability to shift an input frequency to a higher output frequency, while maintaining a high granularity. As one non-limiting example, assuming a desired frequency range, Fin 402 that may be output by a processing circuitry, such as control device 110, described above in relation to FIG. 1 is between a minimum frequency, Fmin=f1, and maximum frequency Fmax=f2, while the desired output frequency, Fout 404, may be between frequencies f3 and f4. Using some example values to illustrate the concept:

Example A: no offset for the desired F_out 404 range
    F_in 402: f1-f2 (e.g., 30 kHz-50 kHz) to translate to F_out 404: f3-f4 (e.g. 300 kHz-500 kHz)
Example B: use frequency offset to achieve desired F_out 404 range
    F_in 402: 10 kHz-50 kHz to translate to F_out 404: f3-f4 (e.g. 300-500 kHz)
Example A—Without using a frequency offset:
    F_out=F_in*N; where N=10
    EG: F_out(F_in)=F_in*10
    F_out(f1)=F_out (30 kHz)=300 kHz;
    F_out(f2)=F_out(50 kHz)=500 kHz;
    Resolution n=10 and the Delta 1 Hz in F_in while Delta is 10 Hz in F_out
Example B—Using a frequency offset, e.g. F_base 302 shown in FIG. 3:
    F_out=F_Base+F_in*N
    F_out=250 Khz+F_in*5; where F_base=250 kHz and N=5
    F_out(f1)=F_out (10 kHz)=250 Khz+10 kHz*5=300 kHz
    F_out(f2)=F_out(50 Khz)=250 Khz+50 kHz*5=500 kHz
    Resolution: N=5 and the Delta is 1 Hz for F_in while Delta is 5 Hz in F_out
More generally:
    Fmin of Fprimary 408 translates to Fmin of Fsecondary 410
    Fmax of Fprimary 408 translates to Fmax of Fsecondary 410

The example A and example B above illustrate that using a frequency offset may provide a high granularity in the desired higher output frequency when compared to translation without an offset. In this manner, using a frequency offset may provide a system designer with enough degrees of freedom. In some examples, the techniques illustrated above may also provide emergency features or safety features, which can be implemented when the processing circuitry is sending zero frequency (F_in =0), where a zero frequency may indicate an emergency state of a controller of this disclosure.

Figure 5:
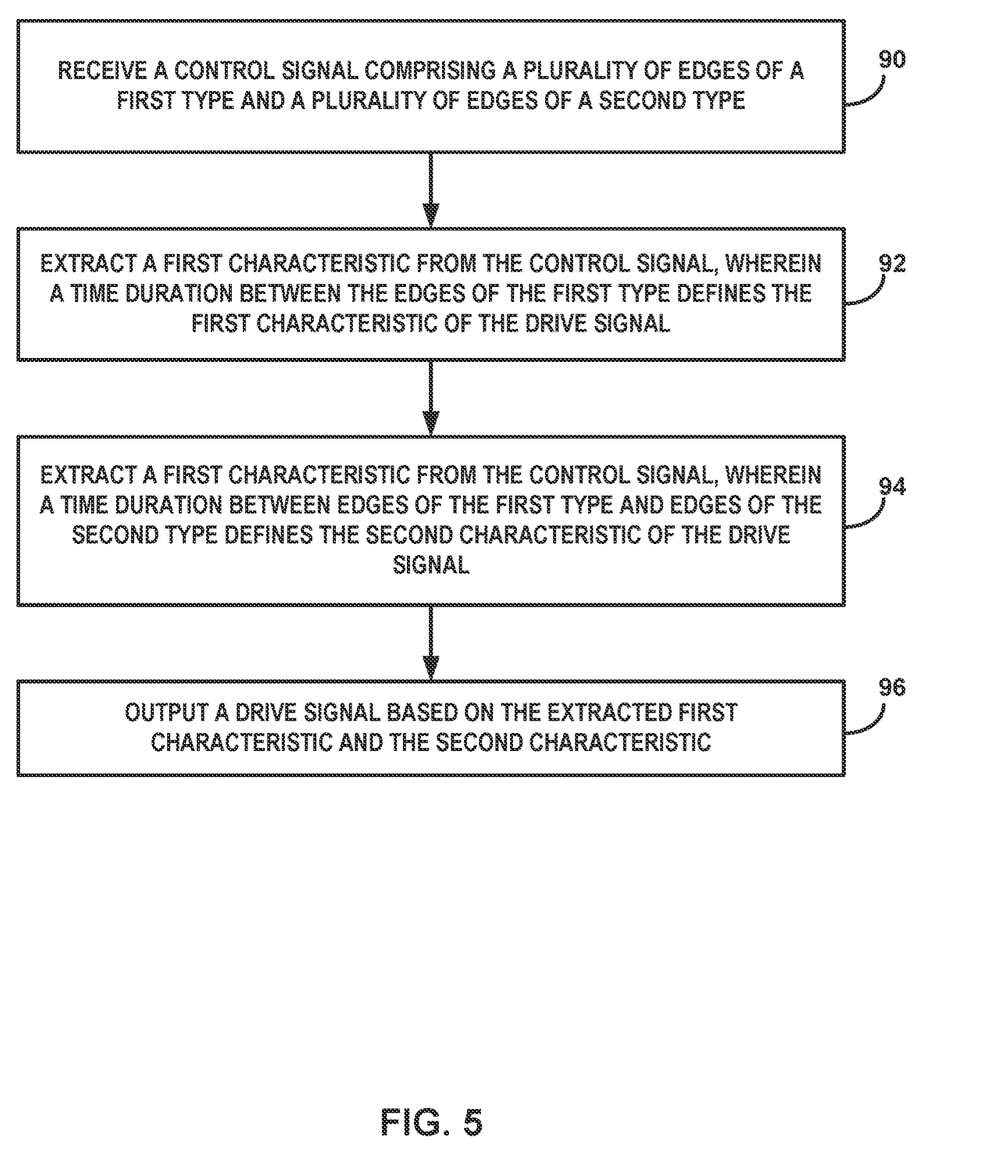
FIG. 5 is a flow chart illustrating an example operation of the system of this disclosure.

FIG. 5 is a flow chart illustrating an example operation of the system of this disclosure. The blocks of FIG. 5 will be described in terms of FIG. 1, unless otherwise noted.

Remote pattern generator 130 may receive a control signal, e.g., intermediate signal 102, which may be a pulse modulated signal including a plurality of edges of a first type and a plurality of edges of a second type (90). Control device 110 may generate the control signal based on feedback from load 160 and may modulate desired characteristics for a drive signal to driving stage 140 onto various "channels" of the control signal.

Remote pattern generator 130 may extract the drive signal characteristics from the pulse modulated control signal. For example, a time duration between the edges of the first type may define a first characteristic of the drive signal such as the desired drive signal frequency (92). A frequency multiplier, or similar frequency modification circuit, may generate the drive signal frequency based on the time duration between the rising edges, or the falling edges, of the control signal.

Remote pattern generator 130 may also extract one or more other characteristics from the control signal, such as pattern characteristics. In some examples, a time duration between edges of the first type and edges of the second type may define one or more other characteristics of the drive signal (94). In some examples, the data information to configure the pattern or the driving stages (e.g., output current) is defined by time durations between the rising edges and subsequent falling edges of the cyclical signal as described above in relation to FIG. 2A. Alternatively, the data information to configure the pattern or the driving stages may be defined by time durations between the falling edges and subsequent rising edges of the cyclical signal as described above in relation to FIG. 2B. In some examples, a sequence of pulses may deliver a stream of digitally encoded data symbols from which remote pattern generator 130 may extract data defining pattern characteristics, such as the duty cycle for the drive signal. In some examples, the data stream of data symbols may form a set of data words from which remote pattern generator 130 may derive information that define characteristics for the drive signal. The derived information may also be described as a payload carried by intermediate signal 102.

Remote pattern generator 130 may then output the drive signal based on the extracted characteristics (96). In some examples, the drive signal may control power switches that operate a resonant converter in load 160.

In one or more examples, the functions described above may be implemented in hardware, software, firmware, or any combination thereof. For example, the various components of FIG. 1 may be implemented in hardware, software, firmware, or any combination thereof. If implemented in software, the functions may be stored on a tangible computer-readable storage medium and executed by a processor or hardware-based processing unit.

Instructions may be executed by one or more processors, such as one or more digital signal processors (DSPs), general purpose microprocessors, application specific integrated circuit (ASIC), Field programmable gate array (FPGAs), or other equivalent integrated or discrete logic circuitry. Accordingly, the term "processor," and "processing circuitry" as used herein, such as may refer to any of the foregoing structure or any other structure suitable for implementation of the techniques described herein. Also, the techniques could be fully implemented in one or more circuits or logic elements.

The techniques of this disclosure may be implemented in a wide variety of devices or apparatuses, including a wireless handset, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a hardware unit or provided by a collection of interoperative hardware units, including one or more processors as described The techniques of this disclosure may also be illustrated by the following examples:

Example 1: A system includes a controller configured to output a control signal comprising a plurality of edges of a first type and a plurality of edges of a second type; translation circuitry operatively coupled to the controller, the translation circuitry configured to: receive the control signal; output a drive signal comprising a first characteristic and a second characteristic, wherein: a time duration between the edges of the first type defines the first characteristic of the drive signal, and a time duration between edges of the first type and edges of the second type defines the second characteristic of the drive signal.

Example 2: The system of example 1, wherein the first characteristic comprises a drive signal frequency.

Example 3: The system of examples 1 and 2, wherein the translation circuitry comprises frequency modification circuitry configured to receive the control signal and set the drive signal frequency based on a frequency of the control signal.

Example 4: The system of any combination of examples 1-3, wherein the second characteristic comprises a pattern for the drive signal, wherein the pattern defines one or more of: a duty cycle, a dead time and a timing jitter on an edge of the drive signal.

Example 5: The system of any combination of examples 1-4, wherein the time duration between edges of the first type and edges of the second type of the control signal comprises information to configure the pattern.

Example 6: The system of any combination of examples 1-5, wherein the control signal comprises a cyclical signal including rising edges and falling edges, where data information to configure the pattern is defined by time durations between the falling edges and subsequent rising edges of the cyclical signal.

Example 7: The system of any combination of examples 1-6, wherein the translation circuitry is configured to translate the time duration between edges of the first type and edges of the second type as a data stream of data symbols.

Example 8: The system of any combination of examples 1-7, wherein the translation circuitry is configured to derive information from extracted the data word in the data stream based on a sequence of respective time durations between edges of the first type and edges of the second type.

Example 9: The system of any combination of examples 1-8, wherein the translation circuitry is configured to: store a first derived information defining of the first characteristic at a first storage element; store a second derived information defining of the second characteristic at a second storage element separate from the first storage element.

Example 10: The system of any combination of examples 1-9, wherein the drive signal is configured to operate a driving stage and one or more power switches, wherein the driving stage and one or more power switches control the operation of a power converter.

Example 11: The system of any combination of examples 1-10, wherein the power converter comprises a resonant converter.

Example 12: A pattern generator circuit, the circuit configured to: receive a control signal comprising a plurality of edges of a first type and a plurality of edges of a second type; output a drive signal comprising a first characteristic and a second characteristic, wherein: a time duration between the edges of the first type defines the first characteristic of the drive signal, and a time duration between edges of the first type and edges of the second type defines the second characteristic of the drive signal.

Example 13: The circuit of example 12, wherein the first characteristic comprises a drive signal frequency, and wherein the translation circuitry comprises frequency modification circuitry configured to receive the control signal and set the drive signal frequency based on a frequency of the control signal.

Example 14: The circuit of examples 12 and 13, wherein the frequency modification circuitry comprises a phase locked loop (PLL).

Example 15: The circuit of any combination of examples 12-14, wherein the second characteristic comprises a pattern for the drive signal, wherein the pattern defines one or more of: a duty cycle, a dead time and a timing jitter on an edge of the drive signal.

Example 16: The circuit of any combination of examples 12-15, further comprising a communication interface configured to receive the control signal, translate the time duration between edges of the first type and edges of the second type as a data stream of data symbols, and derive information from extracted data words in the data stream that defines the second characteristic for the drive signal.

Example 17: The circuit of any combination of examples 12-16, wherein the translation circuitry is configured to extract the data word based on a sequence of respective time durations between edges of the first type and edges of the second type.

Example 18: The circuit of any combination of examples 12-17, The circuit of claim 16, where the data word comprises data to define at least a part of the second characteristic.

Example 19: The circuit of any combination of examples 12-18, wherein the control signal comprises a cyclical signal including rising edges and falling edges, where data information to determine the second characteristic is defined by time durations between the falling edges and subsequent rising edges of the cyclical signal.

Example 20: A method includes receiving a control signal comprising a plurality of edges of a first type and a plurality of edges of a second type, extracting a first characteristic from the control signal, wherein a time duration between the edges of the first type defines the first characteristic of the drive signal; extracting a second characteristic from the control signal, wherein a time duration between edges of the first type and edges of the second type defines the second characteristic of the drive signal; outputting the drive signal based on the extracted first characteristic and the second characteristic.

Various examples of the disclosure have been described. These and other examples are within the scope of the following claims.

What is claimed is:

1. A system comprising:
a controller configured to:
   output a control signal comprising a plurality of edges of a first type and a plurality of edges of a second type; and
   modulate information onto the control signal; and
translation circuitry operatively coupled to the controller, the translation circuitry configured to:
   receive the control signal;
   decode the information modulated onto the control signal, wherein the modulated information comprises a first characteristic and a second characteristic; and
   generate a drive signal based on the decoded information;
   output the drive signal comprising the first characteristic and the second characteristic, wherein:
      a time duration between the edges of the first type of the control signal defines the first characteristic of the drive signal, and
      a time duration between edges of the first type and edges of the second type defines the second characteristic of the drive signal.

2. The system of claim 1, wherein the first characteristic comprises a drive signal frequency.

3. The system of claim 2, wherein the translation circuitry comprises frequency modification circuitry configured to receive the control signal and set the drive signal frequency based on a frequency of the control signal.

4. The system of claim 1, wherein the second characteristic comprises a pattern for the drive signal, wherein the pattern defines one or more of: a duty cycle, a dead time and a timing jitter on an edge of the drive signal.

5. The system of claim 4, wherein the time duration between edges of the first type and edges of the second type of the control signal comprises information to configure the pattern.

6. The system of claim 1, wherein the translation circuitry is configured to translate the time duration between edges of the first type and edges of the second type as a data stream of data symbols.

7. The system of claim 6, wherein the translation circuitry is configured to derive information from extracted data words in the data stream based on a sequence of respective time durations between edges of the first type and edges of the second type.

8. The system of claim 7, wherein the translation circuitry is configured to:
   store a first derived information defining the first characteristic at a first storage element;
   store a second derived information defining the second characteristic at a second storage element separate from the first storage element.

9. The system of claim 1, wherein the drive signal is configured to operate a driving stage and one or more power switches, wherein the driving stage and one or more power switches control operation of a power converter.

10. The system of claim 9, wherein the power converter comprises a resonant converter.

11. A pattern generator circuit, the circuit configured to:
receive a control signal comprising a plurality of edges of a first type and a plurality of edges of a second type;
decode information modulated onto the control signal, wherein the modulated information comprises a first characteristic and a second characteristic; and
generate a drive signal based on the decoded information;
output the drive signal comprising the first characteristic and the second characteristic, wherein:
- a time duration between the edges of the first type defines the first characteristic of the drive signal, and
- a time duration between edges of the first type and edges of the second type defines the second characteristic of the drive signal.

12. The circuit of claim 11,
wherein the first characteristic comprises a drive signal frequency, and
wherein the pattern generator circuit further comprises frequency modification circuitry configured to receive the control signal and set the drive signal frequency based on a frequency of the control signal.

13. The circuit of claim 12, wherein the frequency modification circuitry comprises a phase locked loop (PLL).

14. The circuit of claim 11, wherein the second characteristic comprises a pattern for the drive signal, wherein the pattern defines one or more of: a duty cycle, a dead time and a timing jitter on an edge of the drive signal.

15. The circuit of claim 11, further comprising a communication interface configured to:
receive the control signal;
translate the time duration between edges of the first type and edges of the second type as a data stream of data symbols and
derive information from extracted data words in the data stream that defines the second characteristic for the drive signal.

16. The circuit of claim 15, where the data words comprises data to define at least a part of the second characteristic.

17. A method comprising:
receiving a control signal comprising a plurality of edges of a first type and a plurality of edges of a second type,
decoding information modulated onto the control signal, wherein the modulated information comprises a first characteristic and a second characteristic
extracting the first characteristic from the control signal, wherein a time duration between the edges of the first type defines the first characteristic of a drive signal;
extracting the second characteristic from the control signal, wherein a time duration between edges of the first type and edges of the second type defines the second characteristic of the drive signal;
outputting the drive signal based on the extracted first characteristic and the second characteristic.

18. The method of claim 17, wherein the first characteristic comprises a drive signal frequency.

19. The method of claim 18, wherein the translation circuitry comprises frequency modification circuitry configured to receive the control signal and set the drive signal frequency based on a frequency of the control signal.

20. The method of claim 17, wherein the second characteristic comprises a pattern for the drive signal, wherein the pattern defines one or more of: a duty cycle, a dead time and a timing jitter on an edge of the drive signal.

* * * * *